(12) United States Patent
Kim et al.

(10) Patent No.: US 8,395,953 B2
(45) Date of Patent: Mar. 12, 2013

(54) BIT-LINE SENSE AMPLIFIER, SEMICONDUCTOR MEMORY DEVICE HAVING THE SAME, AND METHOD OF TESTING BIT-LINE MICRO-BRIDGE DEFECT

(75) Inventors: Cheol Kim, Seoul (KR); Sang-Kyun Park, Hwaseong-Si (KR); Jung-Bae Lee, Yongin-Si (KR); Jun-Phyo Lee, Yongin-Si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 279 days.

(21) Appl. No.: 12/958,726

(22) Filed: Dec. 2, 2010

(65) Prior Publication Data
US 2011/0199836 A1 Aug. 18, 2011

(30) Foreign Application Priority Data
Feb. 12, 2010 (KR) .................. 10-2010-0013481

(51) Int. Cl.
*G11C 7/00* (2006.01)
(52) U.S. Cl. ......... 365/203; 365/201; 365/205; 365/226
(58) Field of Classification Search .................. 365/201, 365/203, 205, 226
See application file for complete search history.

(56) References Cited

U.S. PATENT DOCUMENTS

2009/0268534 A1* 10/2009 Kubouchi et al. ............. 365/201
2009/0313513 A1* 12/2009 Do ................................. 714/721

FOREIGN PATENT DOCUMENTS

| KR | 10-0543922 | 5/2005 |
| KR | 10-2007-0044698 A | 4/2007 |
| KR | 10-2008-0057385 A | 6/2008 |

* cited by examiner

*Primary Examiner* — Hoai V Ho
(74) *Attorney, Agent, or Firm* — Muir Patent Consulting, PLLC (57) ABSTRACT

The bit-line sense amplifier includes a driving-voltage control circuit and an amplifier. The driving-voltage control circuit generates a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode. The amplifier senses and amplifies a voltage difference between the bit-line and the complementary bit-line.

20 Claims, 9 Drawing Sheets

BIT-LINE SENSE AMPLIFIER, SEMICONDUCTOR MEMORY DEVICE HAVING THE SAME, AND METHOD OF TESTING BIT-LINE MICRO-BRIDGE DEFECT

PRIORITY STATEMENT

This application claims the benefit of priority under 35 U.S.C. §119 from Korean Patent Application No. 10-2010-0013481, filed on Feb. 12, 2010, in the Korean Intellectual Property Office (KIPO), the contents of which are hereby incorporated herein by reference in their entirety.

BACKGROUND

1. Technical Field

Example embodiments relate to a semiconductor memory device, and particularly to a bit-line sense amplifier suitable for testing a defect of a memory cell array and a semiconductor memory device including the bit-line sense amplifier.

2. Description of Related Art

Semiconductor memory devices are used in various electronic products and applications. In a semiconductor memory device, a memory cell is located at an intersecting point of a bit-line and a word-line, and a sense amplifier is coupled to the bit-line to sense and amplify a voltage of the memory cell, and a sub-word-line driving circuit for generating word-line driving signals is coupled to word-lines.

Because of a change of a semiconductor fabrication process, an unwanted current path such as a micro-bridge may be formed. When the unwanted current path is formed, a read error of data in a semiconductor device may be generated. Therefore, a semiconductor memory chip having the micro bridge may be screened as a bad chip.

If a charge sharing period is long during a test of the bit-line micro-bridge, a leakage current may be flowed through a PMOS transistor or an NMOS transistor comprising an amplifier. Therefore, there may a case that a semiconductor memory chip without the bit-line micro-bridge defect is screened as a bad chip.

SUMMARY

Some example embodiments provide a bit-line sense amplifier capable of detecting a bit-line micro-bridge defect precisely.

Embodiments also provide a semiconductor memory device including the bit-line sense amplifier.

Embodiments also provide a method of detecting a bit-line micro-bridge defect.

The technical objectives of the inventive concept are not limited to the above disclosure; other objectives may become apparent to those of ordinary skill in the art based on the following descriptions.

In one embodiment, a bit-line sense amplifier includes a driving-voltage control circuit and an amplifier.

The driving-voltage control circuit generates a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode. The amplifier senses and amplifies a voltage difference between the bit-line and the complementary bit-line based on the first test driving voltage, the second test driving voltage and the third test driving voltage in the test mode.

In some embodiments, a P-type sense amplifier of the amplifier may be driven by the second test driving voltage, and an N-type sense amplifier of the amplifier is driven by the first test driving voltage when a voltage of the bit-line has the same voltage level as the second test driving voltage and a voltage of the complementary bit-line has the same voltage level as the first test driving voltage after a charge-sharing is completed.

In some embodiments, a P-type sense amplifier of the amplifier may be driven by the first test driving voltage, and an N-type sense amplifier of the amplifier is driven by the third test driving voltage when a voltage of the bit-line has the same voltage level as the third test driving voltage and a voltage of the complementary bit-line has the same voltage level as the first test driving voltage after a charge-sharing is completed.

In some embodiments, the bit-line sense amplifier may further comprise a high supply-voltage supplying circuit and a low supply-voltage supplying circuit.

The high supply-voltage supplying circuit supplies a high supply voltage to the amplifier in a normal mode. The low supply-voltage supplying circuit supplies a low supply voltage to the amplifier in the normal mode.

In some embodiments, the high supply-voltage supplying circuit may include a PMOS transistor and the low supply-voltage supplying circuit includes an NMOS transistor.

In some embodiments, the bit-line sense amplifier may further comprise a pre-charge circuit that provides a bit-line pre-charge voltage to a first driving-voltage supplying line and a second driving-voltage supplying line coupled to the amplifier in a pre-charge mode, and that equalizes a voltage of the first driving-voltage supplying line and a voltage of the second driving-voltage supplying line.

In some embodiments, the amplifier may comprise a first PMOS transistor, a second PMOS transistor, a first NMOS transistor and a second NMOS transistor.

The first PMOS transistor has a source connected to the bit-line, a gate connected to the complementary bit-line, and a drain connected to a first driving-voltage supplying line. The second PMOS transistor has a source connected to the complementary bit-line, a gate connected to the bit-line, and a drain connected to the first driving-voltage supplying line. The first NMOS transistor has a drain connected to the bit-line, a gate connected to the complementary bit-line, and a source connected to a second driving-voltage supplying line. The second NMOS transistor has a drain connected to the second driving-voltage supplying line, a gate connected to the bit-line, and a source connected to the complementary bit-line.

In some embodiments, the second test driving-voltage may be provided to the first driving-voltage supplying line and the first test driving-voltage may be provided to the second driving-voltage supplying line when a data "1" of a memory cell coupled to the bit-line is sensed.

In some embodiments, a leakage current may not flow through the first PMOS transistor when a bit-line micro-bridge defect is not detected, and a leakage current may be reduced when a bit-line micro-bridge defect is detected.

In some embodiments, the first test driving voltage may be provided to the first driving-voltage supplying line and the third test driving voltage may be provided to the second driving-voltage supplying line when a data "0" of a memory cell coupled to the bit-line is sensed.

In some embodiments, a leakage current may not flow through the first NMOS transistor when a bit-line micro-bridge defect is detected, and a leakage current may be reduced when a bit-line micro-bridge defect is detected.

In some embodiments, the driving-voltage control circuit may comprise a test driving-voltage generating circuit and a switch circuit.

The test driving-voltage generating circuit generates the first test driving voltage, the second test driving voltage and the third test driving voltage in response to a first switch control signal and a second switch control signal having opposite phase each other in the test mode. The switch circuit provides the first test driving voltage, the second test driving voltage and the third test driving voltage to driving-voltage supplying lines coupled to the amplifier in response to a third switch control signal in the test mode.

In some embodiments, the first switch control signal, the second switch control signal and the third switch control signal may be generated based on a mode-register-set signal (MRS).

In some embodiments, the test driving-voltage generating circuit may comprise a first MOS transistor, a second MOS transistor, a third MOS transistor and a fourth MOS transistor.

The first MOS transistor transmits the first test driving voltage to the switch circuit in response to the first switch control signal. The second MOS transistor transmits the second test driving voltage to the switch circuit in response to the second switch control signal. The third MOS transistor transmits the first test driving voltage to the switch circuit in response to the second switch control signal. The fourth MOS transistor transmits the third test driving voltage to the switch circuit in response to the first switch control signal.

In accordance with an aspect of the inventive concept, a memory core includes a first memory cells coupled to a bit-line, a second memory cells coupled to a complementary bit-line, a bit-line sense amplifier and a column selecting circuit.

The bit-line sense amplifier senses a voltage difference between the bit-line and the complementary bit-line based on a first test driving voltage having a voltage level of a pre-charge voltage, a second test driving voltage having a voltage level of the pre-charge voltage added by the voltage difference, and a third test driving voltage having a voltage level of the pre-charge voltage subtracted by the voltage difference in a test mode. The column selecting circuit electrically couples the bit-line and the complementary bit-line to a local input/output line pair in response to a column selecting signal.

In accordance with an aspect of the inventive concept, a semiconductor memory device includes a memory core, a local sense amplifier, an input/output sense amplifier and an input/output buffer.

The memory core amplifies a voltage difference between a bit-line and a complementary bit-line and provides the amplified voltage difference to a local input/output line pair. The local sense amplifier amplifies a voltage signal of the local input/output line pair and provides the amplified voltage signal to a global input/output line pair. The input/output sense amplifier amplifies a voltage signal of the global input/output line pair. The input/output buffer buffers and outputs an output signal of the input/output sense amplifier or buffers input data. The memory core senses a voltage difference between the bit-line and the complementary bit-line based on a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode.

In some embodiments, a leakage current may not flow through a bit-line sense amplifier of the memory core when a bit-line micro-bridge defect is not detected.

In one embodiment, a method of testing a bit-line micro-bridge defect includes generating a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode and detecting a voltage difference between the bit-line and the complementary bit-line based on the first test driving voltage, the second test driving voltage and the third test driving voltage in the test mode.

The bit-line sense amplifier according to embodiments of the inventive concept provides a test driving voltage in a test mode different from a test driving voltage in a normal mode. Therefore, a leakage current does not flow through the bit-line sense amplifier when the defect of a bit-line is tested. Therefore, the bit-line sense amplifier is capable of detecting a bit-line micro-bridge defect precisely.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Figure 1:
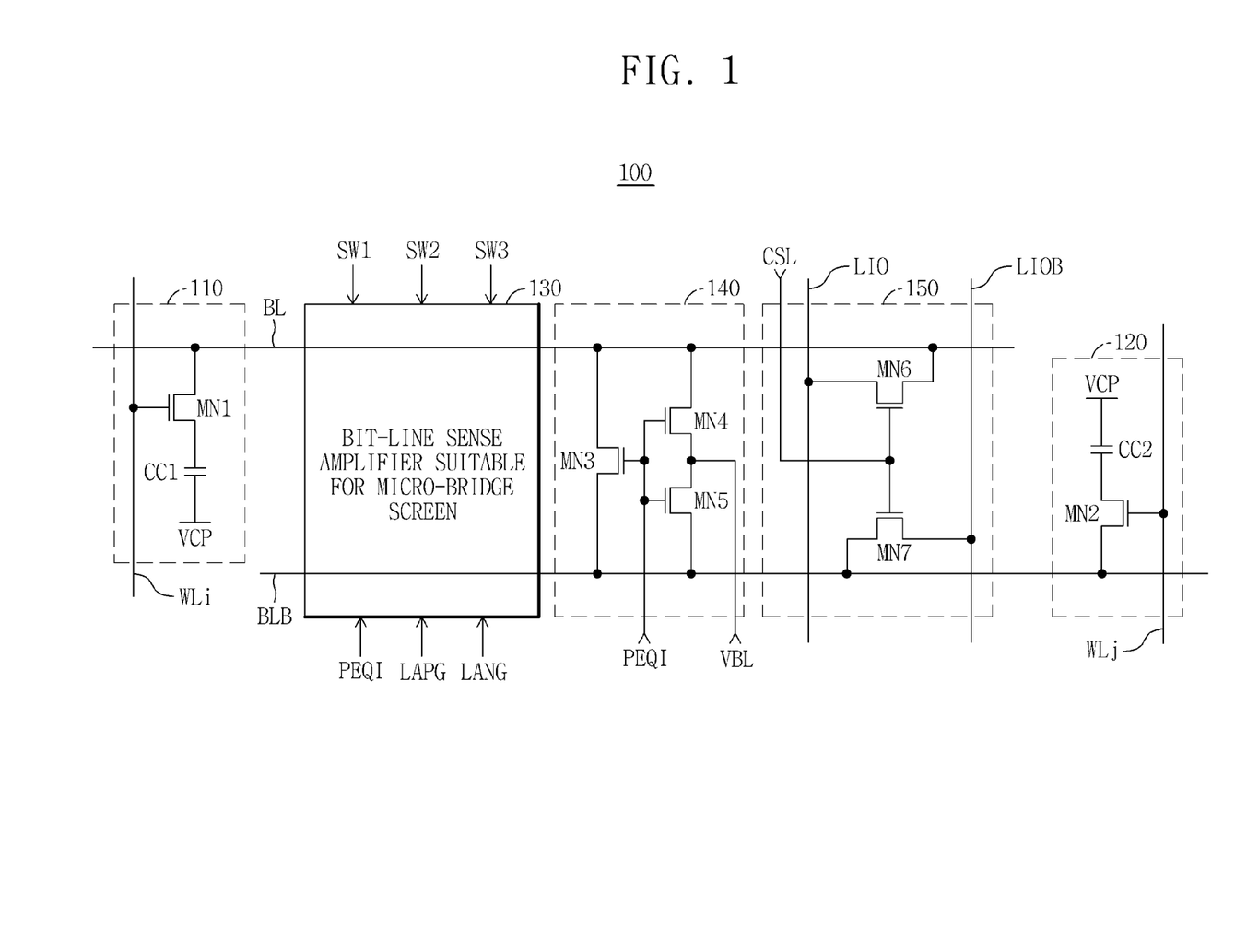
FIG. 1 is a circuit diagram illustrating a structure of a memory core having a bit-line sense amplifier according to an example embodiment.

FIG. 1 is a circuit diagram illustrating a structure of a memory core 100 having a bit-line sense amplifier according to an example embodiment.

Referring to FIG. 1, the memory core 100 includes a first memory cell 110 coupled to a bit-line BL, a second memory cell 120 coupled to a complementary bit-line BLB, a bit-line sense amplifier 130 coupled between the bit-line BL and the complementary bit-line BLB, a first pre-charge circuit 140 and a column selecting circuit 150.

The bit-line sense amplifier 130 senses and amplifies a voltage difference between the bit-line BL and the complementary bit-line BLB in response to control signals PEQI, LANG, LAPG, SW1, SW2 and SW3. Further, the bit-line sense amplifier 130 senses a voltage difference dVBL between the bit-line BL and the complementary bit-line BLB based on a first test driving voltage having a voltage level of a pre-charge voltage VBL, a second test driving voltage having a voltage level of the pre-charge voltage VBL added by the voltage difference dVBL between the bit-line BL and the complementary bit-line BLB, and a third test driving voltage having a voltage level of the pre-charge voltage VBL subtracted by the voltage difference dVBL in a test mode.

The first pre-charge circuit 140 provides the pre-charge voltage VBL to the bit-line BL and the complementary bit-line BLB, and equalizes the bit-line BL and the complementary bit-line BLB in response to an equalization control signal PEQI in a pre-charge mode. The column selecting circuit 150 electrically couples the bit-line BL and the complementary bit-line BLB to a local input/output line pair LIO and LIOB in response to a column selecting signal CSL.

The first memory cell 110 may include a first NMOS transistor MN1 and a first cell capacitor CC1 connected in series to each other, and the second memory cell 120 may include a second NMOS transistor MN2 and a second cell capacitor CC2 connected in series to each other. A cell plate voltage VCP is applied to one end of the first cell capacitor CC1 and one end of the second cell capacitor CC2. A drain of the first NMOS transistor MN1 is connected to the bit line BL, and a word-line driving signal WLi is applied to a gate of the first NMOS transistor MN1. A drain of the second NMOS transistor MN2 is connected to the bit line BL, and a word-line driving signal WLj is applied to a gate of the second NMOS transistor MN2.

The first pre-charge circuit 140 may include a third NMOS transistor MN3, a fourth NMOS transistor MN4 and a fifth NMOS transistor MN5. The third NMOS transistor MN3 has a drain connected to the bit line BL, a source connected to the complementary bit-line BLB, and a gate to which the equalization control signal PEQI is applied. The fourth NMOS transistor MN4 has a source connected to the bit line BL, a drain to which the pre-charge voltage VBL is applied, and a gate to which the equalization control signal PEQI is applied. The fifth NMOS transistor MN5 has a source connected to the complementary bit-line BLB, a drain to which the pre-charge voltage VBL is applied, and a gate to which the equalization control signal PEQI is applied.

The column selecting circuit 150 may include a sixth NMOS transistor MN6 and a seventh NMOS transistor MN7. The sixth NMOS transistor MN6 has a drain connected to the bit line BL, a source connected to a first local input/output line LIO, and a gate to which the column selecting signal CSL is applied.

Figure 2:
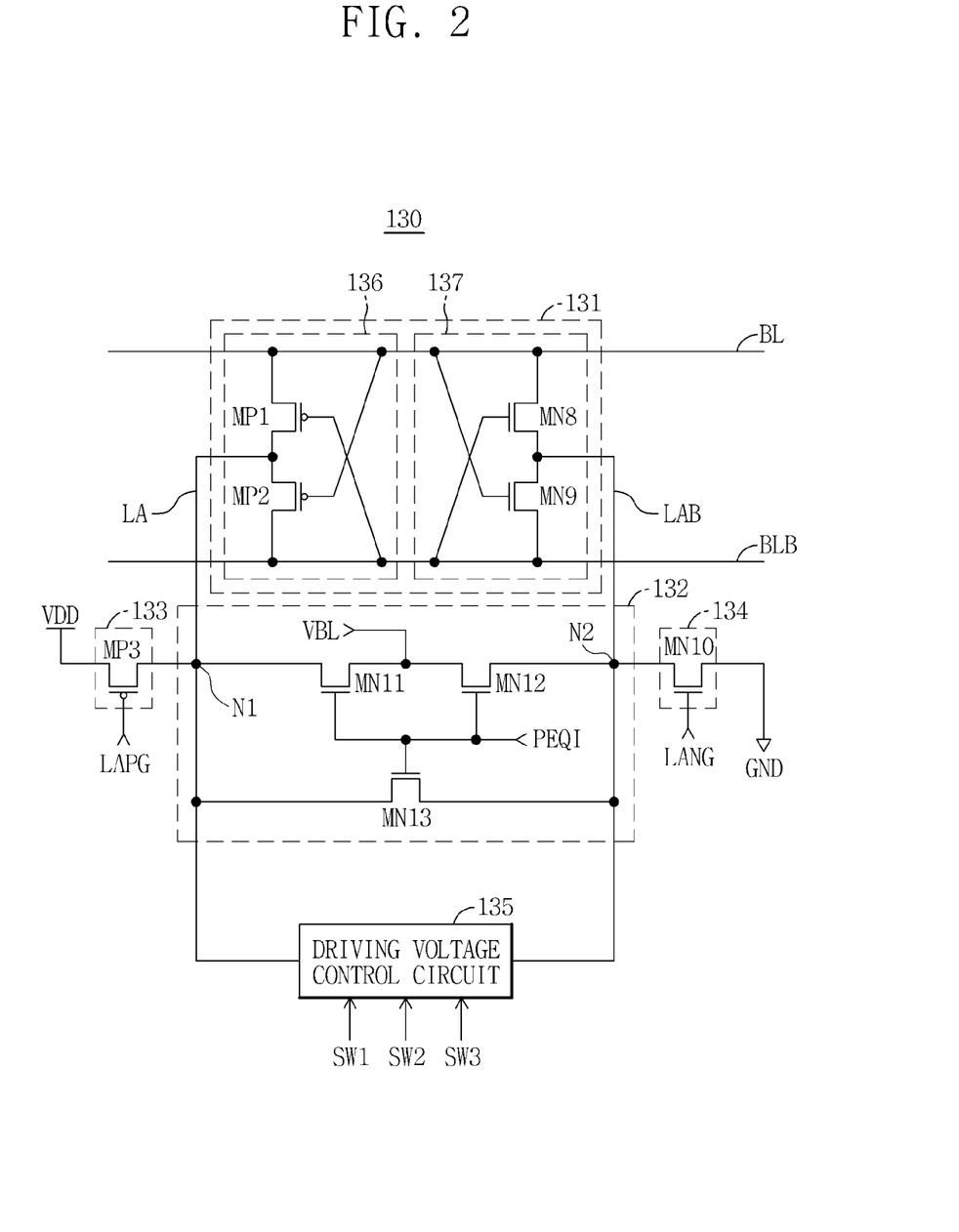
FIG. 2 is a circuit diagram illustrating an example of a bit-line sense amplifier included in the memory core shown in FIG. 1.

FIG. 2 is a circuit diagram illustrating an example of a bit-line sense amplifier 130 included in the memory core 100 shown in FIG. 1.

Referring to FIG. 2, the bit-line sense amplifier 130 includes an amplifier 131, a second pre-charge circuit 132, a high supply-voltage supplying circuit 133, a low supply-voltage supplying circuit 134 and a driving-voltage control circuit 135.

The driving-voltage control circuit 135 generates the first test driving voltage having a voltage level of the pre-charge voltage VBL, the second test driving voltage having a voltage level of the pre-charge voltage VBL added by a voltage difference dVBL between the bit-line and the complementary bit-line BLB, and the third test driving voltage having a voltage level of the pre-charge voltage VBL subtracted by the voltage difference dVBL in a test mode. The amplifier 131 senses and amplifies a voltage difference dVBL between the bit-line BL and the complementary bit-line BLB based on the first test driving voltage, the second test driving voltage and the third test driving voltage in the test mode.

The high supply-voltage supplying circuit 133 supplies a high supply voltage to the amplifier in a normal mode, and the low supply-voltage supplying circuit 134 supplies a low supply voltage to the amplifier in the normal mode. The second pre-charge circuit 132 provides the pre-charge voltage to a first driving-voltage supplying line LA and a second driving-voltage supplying line LAB coupled to the amplifier 131 in a pre-charge mode, and to equalize a voltage of the first driving-voltage supplying line LA and a voltage of the second driving-voltage supplying line LAB.

The amplifier 131 may include a P-type sense amplifier 136 comprised of a first PMOS transistor MP1 and a second PMOS transistor MP2, and an N-type sense amplifier 137 comprised of an eighth NMOS transistor MN8 and a ninth NMOS transistor MN9.

The first PMOS transistor MP1 has a source connected to the bit-line BL, a gate connected to the complementary bit-line BLB, and a drain connected to a first driving-voltage supplying line LA. The second PMOS transistor MP2 has a source connected to the complementary bit-line BLB, a gate connected to the bit-line BL, and a drain connected to the first driving-voltage supplying line LA. The eighth NMOS transistor MN8 has a drain connected to the bit-line BL, a gate connected to the complementary bit-line BLB, and a source connected to a second driving-voltage supplying line LAB. The ninth NMOS transistor MN9 has a drain connected to the second driving-voltage supplying line LAB, a gate connected to the bit-line BL, and a source connected to the complementary bit-line BLB.

The second test driving-voltage may be provided to the first driving-voltage supplying line LA and the first test driving-voltage may be provided to the second driving-voltage supplying line LAB when a data "1" of a memory cell 110 coupled to the bit-line BL is sensed. Therefore, in the bit-line sense amplifier 130 according to the embodiment, a leakage current does not flow through the first PMOS transistor MP1 when a bit-line micro-bridge defect is not detected, and the leakage current can be reduced when a bit-line micro-bridge is detected.

The first test driving-voltage may be provided to the first driving-voltage supplying line LA and the third test driving-voltage may be provided to the second driving-voltage supplying line LAB when a data "0" of the memory cell 110 coupled to the bit-line BL is sensed. Therefore, in the bit-line sense amplifier 130 according to the inventive concept, a leakage current does not flow through the eighth NMOS transistor MN8 when a bit-line micro-bridge defect is not detected, and the leakage current can be reduced when a bit-line micro-bridge is detected.

The high supply-voltage supplying circuit 133 may include a third PMOS transistor MP3 that operates in response to a control signal LAPG, the low supply-voltage supplying circuit 134 may include a tenth NMOS transistor MN10 that operates in response to a control signal LANG.

The second pre-charge circuit 132 may include an eleventh NMOS transistor MN11, a twelfth NMOS transistor MN12 and a thirteenth NMOS transistor MN13. The eleventh NMOS transistor MN11 has a source connected to a first node N1, a drain to which the pre-charge voltage VBL is applied, and a gate to which the equalization control signal PEQI is applied. The twelfth NMOS transistor MN12 has a source connected to a second node N2, a drain to which the pre-charge voltage VBL is applied, and a gate to which the equalization control signal PEQI is applied. The first node N1 is connected to the first driving-voltage supplying line LA, and the second node N2 is connected to the second driving-voltage supplying line LAB. The thirteenth NMOS transistor MN13 has a source connected to a second node N2, a drain connected to the first node N1, a source connected to the second node N2, and a gate to which the equalization control signal PEQI is applied.

Figure 3:
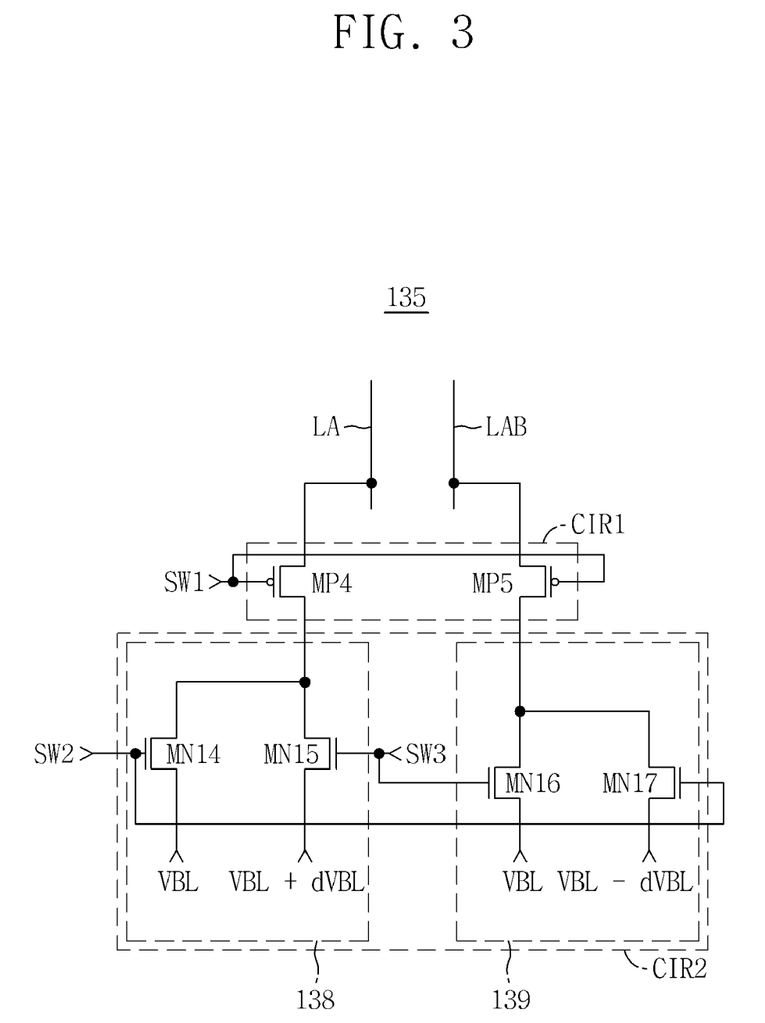
FIG. 3 is a circuit diagram illustrating an example of a driving-voltage control circuit included in the bit-line sense amplifier shown in FIG. 2.

FIG. 3 is a circuit diagram illustrating an example of a driving-voltage control circuit 135 included in the bit-line sense amplifier 130 shown in FIG. 2.

Referring to FIG. 3, the driving-voltage control circuit 135 may include a switch circuit CIR1 and a test driving-voltage generating circuit CIR2.

The test driving-voltage generating circuit CIR2 generates the first test driving voltage, the second test driving voltage and the third test driving voltage in response to a second switch control signal SW2 and a third switch control signal SW3 having opposite phase each other in the test mode.

The test driving-voltage generating circuit CIR2 may include a first test driving-voltage generating circuit 138 that outputs the first test driving voltage and the second test driving voltage in response to the second switch control signal SW2 and the third switch control signal SW3, and a second driving-voltage generating circuit 139 that outputs the first test driving voltage and the third test driving voltage in response to the second switch control signal SW2 and the third switch control signal SW3. As described above, the first test driving voltage has a voltage level of a pre-charge voltage VBL, the second test driving voltage has a voltage level of the pre-charge voltage VBL added by the voltage difference dVBL between the bit-line BL and the complementary bit-line BLB, and the third test driving voltage has a voltage level of the pre-charge voltage VBL subtracted by the voltage difference dVBL in a test mode.

The switch circuit CIR1 provides output signals of the test driving-voltage generating circuit CIR2 to the first driving-voltage supplying line LA and the second driving-voltage supplying line LAB in response to a first switch control signal SW1.

The first test driving-voltage generating circuit 138 may include a fourteenth NMOS transistor MN14 and a fifteenth NMOS transistor MN15. The fourteenth NMOS transistor MN14 outputs the first test driving voltage having a voltage level of a pre-charge voltage VBL in response to the second switch control signal SW2. The fifteenth NMOS transistor MN15 outputs the second test driving voltage having a voltage level of a pre-charge voltage VBL added by the voltage difference dVBL between the bit-line BL and the complementary bit-line BLB in response to the third switch control signal SW3.

The second test driving-voltage generating circuit 139 may include a sixteenth NMOS transistor MN16 and a seventeenth NMOS transistor MN17. The sixteenth NMOS transistor MN16 outputs the first test driving voltage having a voltage level of a pre-charge voltage VBL in response to the third switch control signal SW3. The seventeenth NMOS transistor MN17 outputs the third test driving voltage having a voltage level of a pre-charge voltage VBL subtracted by the voltage difference dVBL between the bit-line BL and the complementary bit-line BLB in response to the second switch control signal SW2.

The switch circuit CIR1 may include a fourth PMOS transistor MP4 and a fifth PMOS transistor MP5. The fourth PMOS transistor MP4 transfers an output signal of the first test driving-voltage generating circuit 138 to the first driving-voltage supplying line LA in response to the first switch control signal SW1. The fifth PMOS transistor MP5 transfers an output signal of the second test driving-voltage generating circuit 139 to the second driving-voltage supplying line LAB in response to the first switch control signal SW1.

The first switch control signal SW1, the second switch control signal SW2 and the third switch control signal SW3 may be generated based on a mode register set (MRS) signal.

Figure 4:
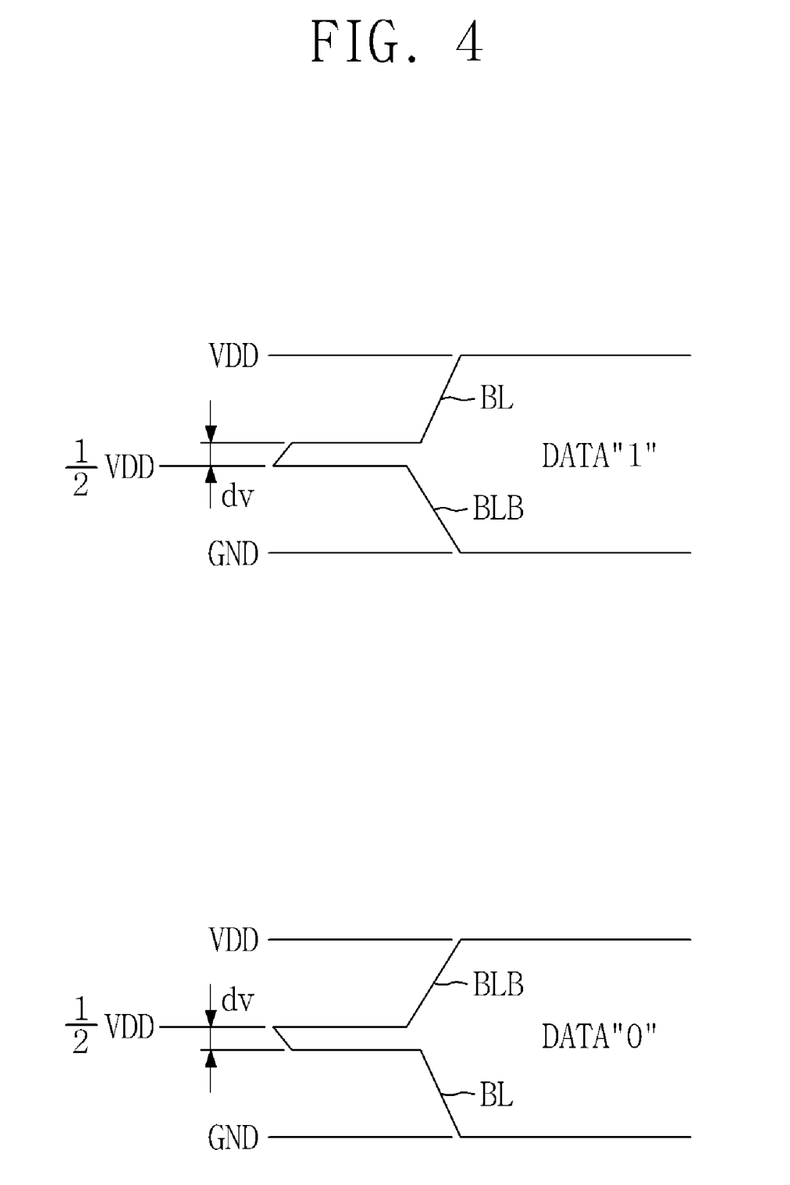
FIG. 4 is a diagram illustrating examples of voltage waveforms of the memory core of FIG. 1.

FIG. 4 is a diagram illustrating examples of voltage waveforms of the bit-line BL and the complementary bit-line BLB of the memory core 100 of FIG. 1.

Referring to FIG. 4, when the memory core 100 senses a data "1", the bit-line BL and the complementary bit-line BLB are pre-charged to (½)*VDD beforehand, and then a voltage of the bit-line BL increases by dV. When amplification is completed by the amplifier 131, a voltage of the bit-line BL may have a voltage level of the supply voltage VDD, and a voltage of the complementary bit-line BLB may have a voltage level of the ground voltage GND.

When the memory core 100 senses a data "0", the bit-line BL and the complementary bit-line BLB are pre-charged to (½)*VDD beforehand, and then a voltage of the bit-line BL decreases by dV. When amplification is completed by the amplifier 131, a voltage of the bit-line BL may have a voltage level of the ground voltage GND, and a voltage of the complementary bit-line BLB may have a voltage level of the supply voltage VDD.

Figure 5:
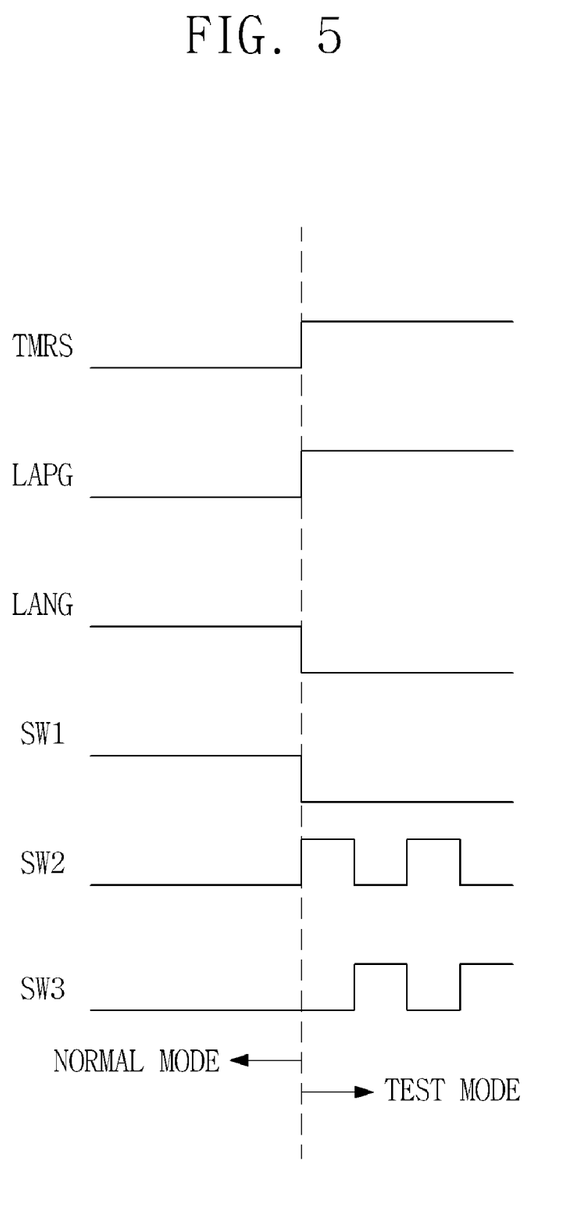
FIG. 5 is a timing diagram illustrating timings of control signals used in the circuits shown in FIG. 2 and FIG. 3.

FIG. 5 is a timing diagram illustrating timings of control signals used in the circuits shown in FIG. 2 and FIG. 3. In FIG. 5, TMRS denotes a mode register set (MRS) signal related to a test operation. LAPG denotes a control signal that controls the high supply-voltage supplying circuit 133, and LANG denotes a control signal that controls the low supply-voltage supplying circuit 134. TMRS may have a disable state in a normal mode, and have an enable state in a test mode. LAPG and LANG may have an enable state in the normal mode, and have a disable state in the test mode. The high supply-voltage supplying circuit 133 includes a PMOS transistor and the low supply-voltage supplying circuit 134 includes an NMOS transistor. Therefore, LAPG has a logic high state and LANG has a logic low state in the test mode.

The first switch control signal SW1 may have a disable state in the normal mode, and have an enable state in the test mode. The second switch control signal SW2 and the third switch control signal SW3 may have a disable state in the normal mode, and have an enable state or a disable state in the test mode. In the test mode, the second switch control signal SW2 and the third switch control signal SW3 may have an opposite phase each other.

Figure 6:
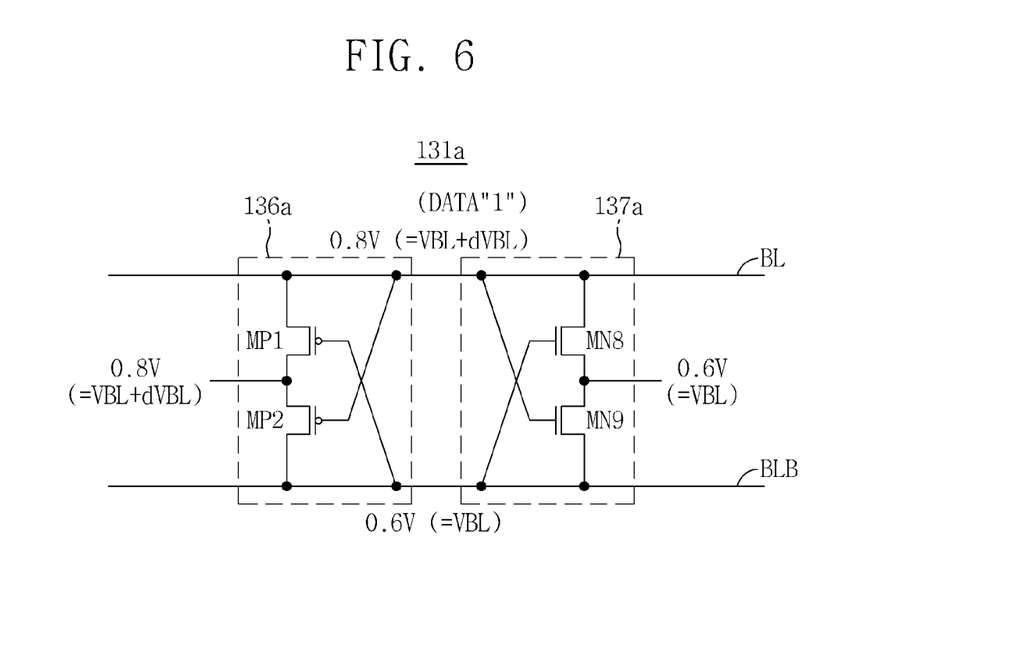
FIG. 6 is a circuit diagram illustrating examples of voltage levels applied to driving-voltage supplying lines coupled to an amplifier when a data "1" of a memory cell coupled to a bit line is sensed.

FIG. 6 is a circuit diagram illustrating examples of voltage levels applied to driving-voltage supplying lines coupled to an amplifier 131a when a data "1" of a memory cell coupled to a bit line is sensed.

Referring to FIG. 6, in case the amplifier 131a senses a data "1", when a voltage of the bit-line BL has the voltage level VBL+dVBL which is the same voltage level of the second test driving voltage, and a voltage of the complementary bit-line BLB has the voltage level VBL which is the same voltage level of the first test driving voltage after a charge-sharing is completed, a P-type sense amplifier 136a of the amplifier 131a may be driven by the second test driving voltage which is provided through the first driving-voltage supplying line LA of FIG. 2, and an N-type sense amplifier 137a of the amplifier 131a is driven by the first test driving voltage which is provided through the second driving-voltage supplying line LAB of FIG. 2. In the example of FIG. 6, the first test driving voltage is 0.6V and the second test driving voltage is 0.8V. Further, in FIG. 6, the pre-charge voltage has a voltage level of VBL and the voltage difference dVBL between the bit-line BL and the complementary bit-line BLB is 0.2V.

As illustrated in FIG. 6, in case a data "1" of a memory cell is sensed in the test mode, when the second test driving voltage of VBL+dVBL which is the same voltage level of the bit-line BL is supplied to the P-type sense amplifier 136a through the first driving-voltage supplying line LA of FIG. 2, a voltage between a drain and a source of the first PMOS transistor MP1 is 0V. Therefore, when a bit-line micro-bridge defect is detected, a leakage current through the first PMOS transistor MP1 can be reduced, and when a bit-line micro-bridge defect is not detected, a leakage current does not flow through the first PMOS transistor MP1 although a voltage of 200 mV (0.8V-0.6V) is applied between a gate and a source of the first PMOS transistor MP1.

In a conventional art, when a bit-line micro-bridge defect is detected or not detected, a voltage of the pre-charge voltage level VBL is supplied to both of the P-type sense amplifier 136a and an N-type sense amplifier 137a through the first driving-voltage supplying line LA of FIG. 2 and the second driving-voltage supplying line LAB of FIG. 2. Therefore, in case a data "1" of a memory cell is sensed in the test mode, a leakage current may flow through the first PMOS transistor MP1 when a time period of charge sharing is long.

Figure 7:
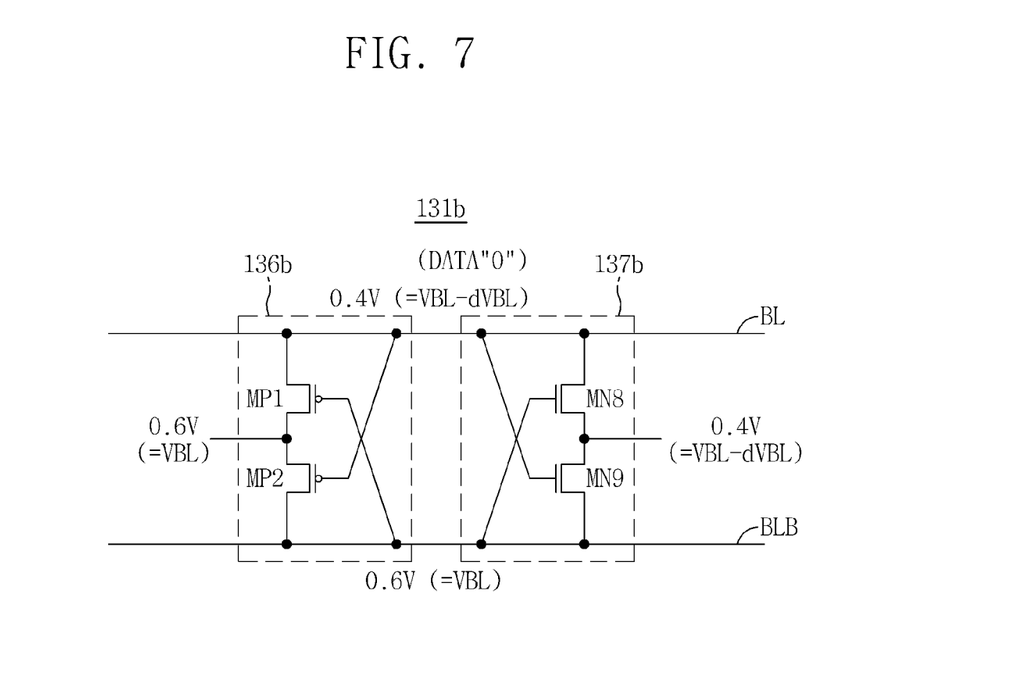
FIG. 7 is a circuit diagram illustrating examples of voltage levels applied to driving-voltage supplying lines coupled to an amplifier when a data "0" of a memory cell coupled to a bit line is sensed.

FIG. 7 is a circuit diagram illustrating examples of voltage levels applied to driving-voltage supplying lines coupled to an amplifier 131b when a data "0" of a memory cell coupled to a bit line is sensed.

Referring to FIG. 7, in case the amplifier 131b senses a data "0", when a voltage of the bit-line BL has the voltage level VBL-dVBL which is the same voltage level of the third test driving voltage, and a voltage of the complementary bit-line BLB has the voltage level VBL which is the same voltage level of the first test driving voltage after a charge-sharing is completed, a P-type sense amplifier 136b of the amplifier 131b may be driven by the first test driving voltage which is provided through the first driving-voltage supplying line LA of FIG. 2, and an N-type sense amplifier 137b of the amplifier 131b is driven by the third test driving voltage which is provided through the second driving-voltage supplying line LAB of FIG. 2. In the example of FIG. 7, the first test driving voltage is 0.6V and the third test driving voltage is 0.4V.

As illustrated in FIG. 7, in case a data "0" of a memory cell is sensed in the test mode, when the third test driving voltage of VBL-dVBL which is the same voltage level of the bit-line BL is supplied to the N-type sense amplifier 137b through the second driving-voltage supplying line LAB of FIG. 2, a voltage between a drain and a source of the eighth NMOS transistor MN8 is 0V. Therefore, when a bit-line micro-bridge defect is detected, a leakage current through the first NMOS transistor MN8 can be reduced, and when a bit-line micro-bridge defect is not detected, a leakage current does not flow through the eighth NMOS transistor MN8 although a voltage of 200 mV (0.6V-0.4V) is applied between a gate and a source of the eighth NMOS transistor MN8.

In a conventional art, when a bit-line micro-bridge defect is detected or not detected, a voltage of the pre-charge voltage level VBL is supplied to both of the P-type sense amplifier 136b and an N-type sense amplifier 137b through the first driving-voltage supplying line LA of FIG. 2 and the second driving-voltage supplying line LAB of FIG. 2. Therefore, in case a data "0" of a memory cell is sensed in the test mode, a leakage current may flow through the eighth NMOS transistor MN8 when a time period of charge sharing is long.

Figure 8:
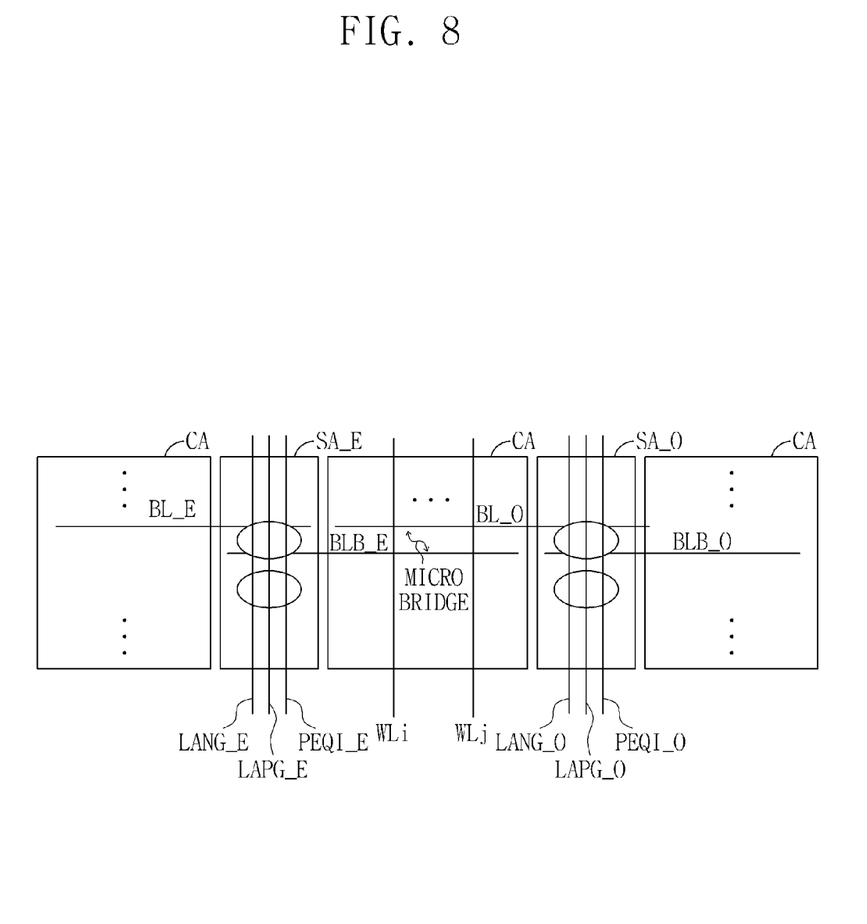
FIG. 8 is a schematic diagram illustrating a layout of a memory core of a semiconductor memory device in which micro-bridge defects exist between bit-lines.

FIG. 8 is a schematic diagram illustrating a layout of a memory core of a semiconductor memory device in which micro-bridge defects exist between bit-lines. In FIG. 8, CA denotes a memory cell array region, and SA_E and SA_O denote sense amplifier regions in which bit-line sense amplifiers are arranged.

Referring to FIG. 8, a first bit-line BL_E and a first complementary bit-line BLB_E are coupled to a bit-line sense amplifier which is located in the sense amplifier region SA_E, and a second bit-line BL_O and a second complementary bit-line BLB_O are coupled to a bit-line sense amplifier which is located in the sense amplifier region SA_O. Bit-line sense amplifiers in the sense amplifier region SA_E operate in response to control signals LANG_E, LAPG_E and PEQI_E, and bit-line sense amplifiers in the sense amplifier region SA_O operate in response to control signals LANG_O, LAPG_O and PEQI_O. In the memory cell array region CA, word-lines WLi and WLj as well as bit-lines are arranged.

When defects are generated in the semiconductor fabrication process, a parasitic current path which is called a micro bridge may be generated between bit-lines of the memory cell array. In FIG. 8, a memory core having a micro bridge between the first bit-line BL_E and the second bit-line BL_O.

Figure 9:
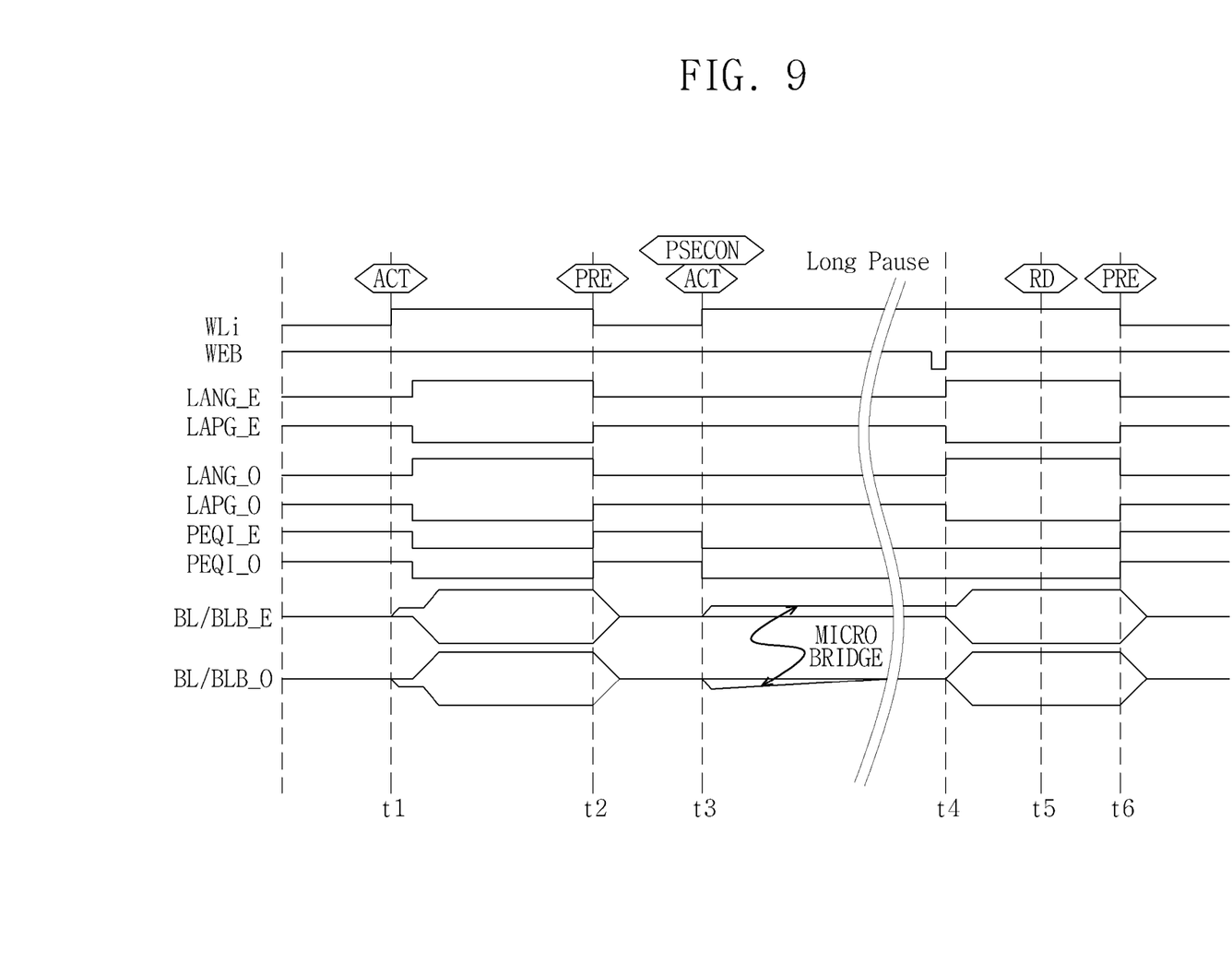
FIG. 9 is a timing diagram illustrating an operation of a memory core of a semiconductor memory device shown in FIG. 1 and FIG. 8 when micro-bridge defects exist between bit-lines.

FIG. 9 is a timing diagram illustrating an operation of a memory core of a semiconductor memory device shown in FIG. 1 and FIG. 8 when micro-bridge defects exist between bit-lines. In FIG. 9, voltage waveforms of bit-lines are shown when a bit-line sense amplifier coupled to BL_E and BLB_E senses a data "1", and a bit-line sense amplifier coupled to BL_O and BLB_O senses a data "0".

Referring to FIG. 9, at time t1, an active command is generated and a semiconductor memory device operates in a normal mode. In the normal mode, the supply voltage VDD is provided to the P-type sense amplifier 136 through the first driving-voltage supplying line LA of FIG. 2, and the ground voltage GND is provided to the N-type sense amplifier 137 through the second driving-voltage supplying line LAB of FIG. 2. In the normal mode, the word-line WLi is enabled and the amplifier 131 senses and amplifies a voltage difference between the bit-line BL and the complementary bit-line BLB base on the supply voltage VDD and the ground voltage GND.

At time t2, a pre-charge command is generated and the word-line WLi is disabled, and the bit-line BL and the complementary bit-line BLB are pre-charged to the pre-charge voltage level, for example VDD/2.

At time t3, a semiconductor memory device including a memory core operates in a test mode when the active command ACT and a test command PSECON are generated. In the test mode, for a sense amplifier coupled to BL_E and BLB_E, the second test driving voltage of VBL+dVBL is provided to the P-type sense amplifier 136 through the first driving-voltage supplying line LA of FIG. 2, and the first driving voltage VBL is provided to the N-type sense amplifier 137 through the second driving-voltage supplying line LAB of FIG. 2. For a sense amplifier coupled to BL_O and BLB_O, the third test driving voltage of VBL-dVBL is provided to the P-type sense amplifier 136 through the first driving-voltage supplying line LA of FIG. 2, and the first driving voltage VBL is provided to the N-type sense amplifier 137 through the second driving-voltage supplying line LAB of FIG. 2. In the test mode, the word-line WLi is enabled and the amplifier 131 senses and amplifies a voltage difference between the bit-line BL and the complementary bit-line BLB base on the first driving voltage VBL, the second test driving voltage of VBL+dVBL, and the third test driving voltage of VBL-dVBL.

In the test mode, the bit-line micro-bridge defect is detected, and a charge-sharing period is longer than the charge-sharing period of the normal mode. In the example of FIG. 8, the micro bridge defect is generated between the first bit-line BL_E and the second bit-line BL_O because of a change of a semiconductor fabrication process. Referring to FIG. 9, it can be noted that a voltage level of the second bit-line BL_O which senses a data "0" increases to the pre-charge voltage level and a data error is generated because the micro-bridge defect.

The memory core of the semiconductor memory device enters the normal mode after testing the bit-line micro-bridge defect (after t4).

Figure 10:
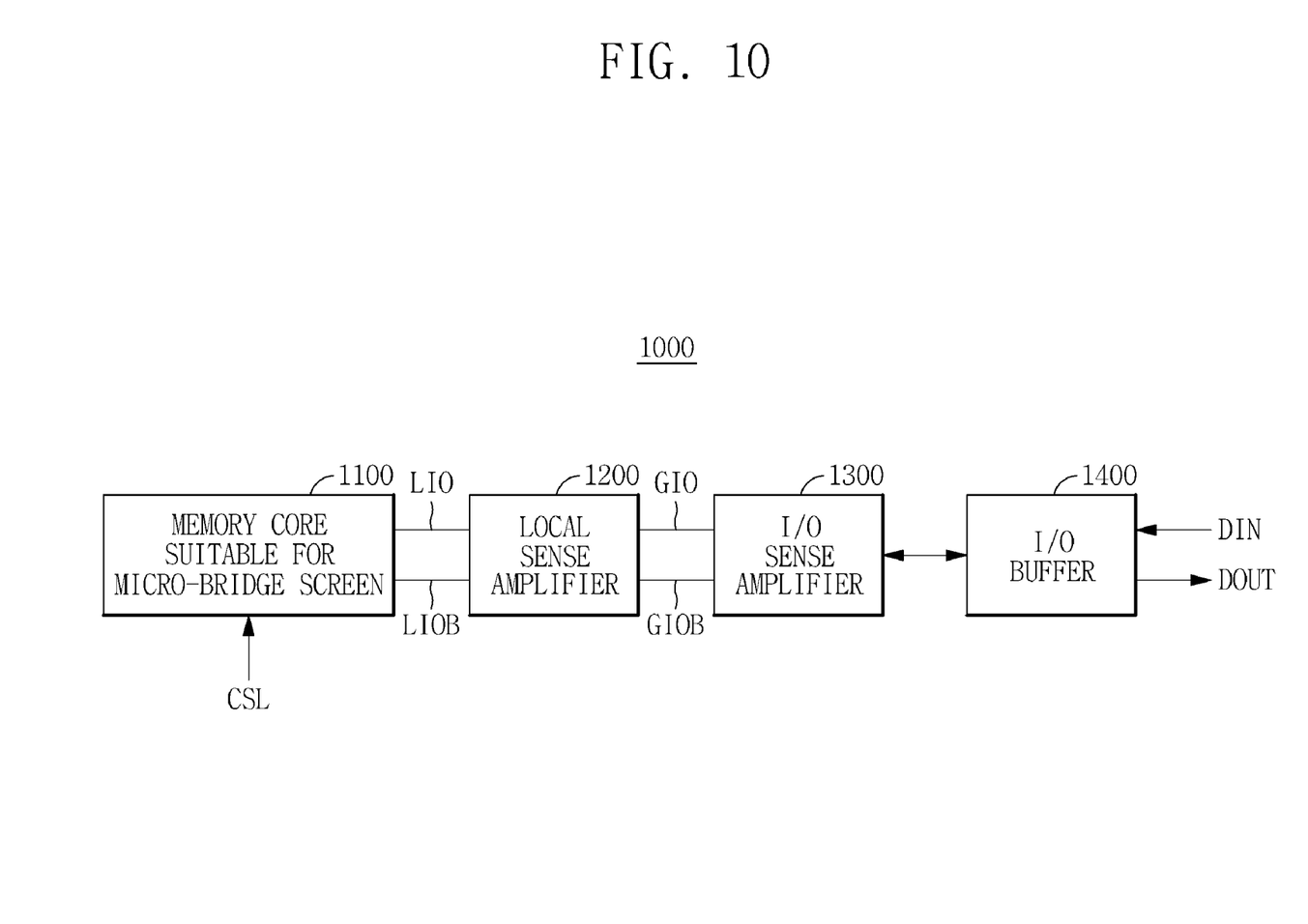
FIG. 10 is a block diagram illustrating a semiconductor memory device including a memory core according to an example embodiment shown in FIG. 1.

FIG. 10 is a block diagram of a semiconductor memory device 1000 including a memory core 100 according to an example embodiment shown in FIG. 1.

The semiconductor memory device 1000 may include a memory core 1100, a local sense amplifier 1200, an input/output sense amplifier 1300 and an input/output buffer 1400.

The memory core 1100 amplifies a voltage difference between a bit-line BL and a complementary bit-line BLB and provides the amplified voltage difference to a local input/output line pair LIO and LIOB. The local sense amplifier 1200 amplifies a voltage signal of the local input/output line pair LIO and LIOB and provides the amplified voltage signal to a global input/output line pair GIO and GIOB. The input/output sense amplifier 1300 amplifies a voltage signal of the global input/output line pair GIO and GIOB. The input/output buffer 1400 buffers and outputs an output signal of the input/output sense amplifier 1300 or buffers input data DIN. An output signal DOUT of the input/output buffer 1400 may be output to an exterior of the semiconductor memory device through an output pad (not shown).

The memory core 1100 included in the semiconductor memory device 1000 may have a structure of the memory core 100 shown in FIG. 1. The memory core 1100 senses a voltage difference between the bit-line BL and the complementary bit-line BLB based on a first test driving voltage having a voltage level of a pre-charge voltage VBL, a second test driving voltage having a voltage level of a pre-charge voltage VBL added by a voltage difference dVBL between the bit-line BL and the complementary bit-line BLB, and a third test driving voltage having a voltage level of a pre-charge voltage VBL subtracted by the voltage difference dVBL in a test mode.

Referring to FIGS. 1 to 9, a method of testing a bit-line micro-bridge defect may be implemented as follows.

1) generate a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode 2) detect a voltage difference between the bit-line and the complementary bit-line based on the first test driving voltage, the second test driving voltage and the third test driving voltage in the test mode In the method of testing a bit-line micro-bridge defect according to example embodiments, the second test driving-voltage is provided to the first driving-voltage supplying line coupled to a P-type sense amplifier and the first test driving-voltage is provided to the second driving-voltage supplying line coupled to an N-type sense amplifier when a data "1" of a memory cell coupled to the bit-line is sensed. The first test driving-voltage is provided to the first driving-voltage supplying line coupled to a P-type sense amplifier and the third test driving-voltage is provided to the second driving-voltage supplying line coupled to an N-type sense amplifier when a data "0" of a memory cell coupled to the bit-line is sensed.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A bit-line sense amplifier, comprising:
    a driving-voltage control circuit configured to generate a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode; and
    an amplifier configured to sense and amplify a voltage difference between the bit-line and the complementary bit-line based on the first test driving voltage, the second test driving voltage and the third test driving voltage in the test mode.

2. The bit-line sense amplifier of claim 1, wherein a P-type sense amplifier of the amplifier is driven by the second test driving voltage, and an N-type sense amplifier of the amplifier is driven by the first test driving voltage when a voltage of the bit-line has the same voltage level as the second test driving voltage and a voltage of the complementary bit-line has the same voltage level as the first test driving voltage after a charge-sharing is completed.

3. The bit-line sense amplifier of claim 1, wherein a P-type sense amplifier of the amplifier is driven by the first test driving voltage, and an N-type sense amplifier of the amplifier is driven by the third test driving voltage when a voltage of the bit-line has the same voltage level as the third test driving voltage and a voltage of the complementary bit-line has the same voltage level as the first test driving voltage after a charge-sharing is completed.

4. The bit-line sense amplifier of claim 1, further comprising:
    a high supply-voltage supplying circuit for supplying a high supply voltage to the amplifier in a normal mode; and
    a low supply-voltage supplying circuit for supplying a low supply voltage to the amplifier in the normal mode.

5. The bit-line sense amplifier of claim 4, wherein the high supply-voltage supplying circuit includes a PMOS transistor and the low supply-voltage supplying circuit includes an NMOS transistor.

6. The bit-line sense amplifier of claim 1, further comprising a pre-charge circuit configured to provide the pre-charge voltage to a first driving-voltage supplying line and a second driving-voltage supplying line coupled to the amplifier in a pre-charge mode, and to equalize a voltage of the first driving-voltage supplying line and a voltage of the second driving-voltage supplying line.

7. The bit-line sense amplifier of claim 1, wherein the amplifier comprises:
    a first PMOS transistor having a source connected to the bit-line, a gate connected to the complementary bit-line, and a drain connected to a first driving-voltage supplying line;
    a second PMOS transistor having a source connected to the complementary bit-line, a gate connected to the bit-line, and a drain connected to the first driving-voltage supplying line;
    a first NMOS transistor having a drain connected to the bit-line, a gate connected to the complementary bit-line, and a source connected to a second driving-voltage supplying line; and
    a second NMOS transistor having a drain connected to the second driving-voltage supplying line, a gate connected to the bit-line, and a source connected to the complementary bit-line.

8. The bit-line sense amplifier of claim 7, wherein the second test driving-voltage is provided to the first driving-voltage supplying line and the first test driving-voltage is provided to the second driving-voltage supplying line when a data "1" of a memory cell coupled to the bit-line is sensed.

9. The bit-line sense amplifier of claim 8, wherein a leakage current does not flow through the first PMOS transistor when a bit-line micro-bridge defect is not detected.

10. The bit-line sense amplifier of claim 7, wherein the first test driving voltage is provided to the first driving-voltage supplying line and the third test driving voltage is provided to the second driving-voltage supplying line when a data "0" of a memory cell coupled to the bit-line is sensed.

11. The bit-line sense amplifier of claim 10, wherein a leakage current does not flow through the first NMOS transistor when a bit-line micro-bridge defect is not detected.

12. The bit-line sense amplifier of claim 1, wherein the driving-voltage control circuit comprises:
   a test driving-voltage generating circuit configured to generate the first test driving voltage, the second test driving voltage and the third test driving voltage in response to a first switch control signal and a second switch control signal having opposite phase each other in the test mode; and
   a switch circuit configured to provide the first test driving voltage, the second test driving voltage and the third test driving voltage to driving-voltage supplying lines coupled to the amplifier in response to a third switch control signal in the test mode.

13. The bit-line sense amplifier of claim 12, wherein the first switch control signal, the second switch control signal and the third switch control signal are configured to be generated based on a mode-register-set signal (MRS).

14. The bit-line sense amplifier of claim 12, wherein the test driving-voltage generating circuit comprises:
   a first MOS transistor configured to transmit the first test driving voltage to the switch circuit in response to the first switch control signal;
   a second MOS transistor configured to transmit the second test driving voltage to the switch circuit in response to the second switch control signal;
   a third MOS transistor configured to transmit the first test driving voltage to the switch circuit in response to the second switch control signal; and
   a fourth MOS transistor configured to transmit the third test driving voltage to the switch circuit in response to the first switch control signal.

15. A memory core, comprising:
   a first memory cells coupled to a bit-line;
   a second memory cells coupled to a complementary bit-line;
   a bit-line sense amplifier configured to sense a voltage difference between the bit-line and the complementary bit-line based on a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode; and
   a column selecting circuit configured to electrically couple the bit-line and the complementary bit-line to a local input/output line pair in response to a column selecting signal.

16. A semiconductor memory device, comprising:
   a memory core configured to amplify a voltage difference between a bit-line and a complementary bit-line and provide the amplified voltage difference to a local input/output line pair;
   a local sense amplifier configured to amplify a voltage signal of the local input/output line pair and provide the amplified voltage signal to a global input/output line pair;
   an input/output sense amplifier configured to amplify a voltage signal of the global input/output line pair; and
   an input/output buffer configured to buffer and output an output signal of the input/output sense amplifier or to buffer input data, wherein the memory core configured to sense a voltage difference between the bit-line and the complementary bit-line based on a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode.

17. The semiconductor memory device of claim 16, wherein a leakage current does not flow through a bit-line sense amplifier of the memory core when a bit-line micro-bridge defect is not detected.

18. A method of testing a bit-line micro-bridge defect, comprising:
   generating a first test driving voltage having a voltage level of a pre-charge voltage, a second test driving voltage having a voltage level of a pre-charge voltage added by a voltage difference between a bit-line and a complementary bit-line, and a third test driving voltage having a voltage level of a pre-charge voltage subtracted by the voltage difference in a test mode; and
   detecting a voltage difference between the bit-line and the complementary bit-line based on the first test driving voltage, the second test driving voltage and the third test driving voltage in the test mode.

19. The bit-line sense amplifier of claim 18, wherein the second test driving-voltage is provided to the first driving-voltage supplying line coupled to a P-type sense amplifier and the first test driving-voltage is provided to the second driving-voltage supplying line coupled to an N-type sense amplifier when a data "1" of a memory cell coupled to the bit-line is sensed.

20. The bit-line sense amplifier of claim 18, wherein the first test driving-voltage is provided to the first driving-voltage supplying line coupled to a P-type sense amplifier and the third test driving-voltage is provided to the second driving-voltage supplying line coupled to an N-type sense amplifier when a data "0" of a memory cell coupled to the bit-line is sensed.

* * * * *